United States Patent

[11] 3,593,186

[72] Inventor Edward C. Dench
Annisquam, Mass.
[21] Appl. No. 800,169
[22] Filed Feb. 18, 1969
[45] Patented July 13, 1971
[73] Assignee Raytheon Company
Lexington, Mass.

[54] THERMAL DISSIPATION IN SEMICONDUCTOR DEVICE ARRAYS
6 Claims, 3 Drawing Figs.

[52] U.S. Cl. .......... 331/52, 317/234 A, 317/234 V, 317/234 W, 330/5, 330/34, 330/56, 330/61 A, 331/56, 331/70, 331/96, 331/107 R, 331/107 G, 333/80, 333/83
[51] Int. Cl. .......... H03b 7/14, H03f 3/10, H03f 3/60
[50] Field of Search .......... 317/234, 235, 1, 4, 4.1, 5, 5.4, 6, 11, 23, 234 A, 234 G, 234 H, 234 J, 234 V, 234 W; 333/10, 12, 13, 82—96, 80; 330/5, 34, 56, 61 A; 329/161; 331/52, 56, 69, 70, 96—98, 101, 102, 107 R, 107 G

[56] References Cited
UNITED STATES PATENTS

| | | | |
|---|---|---|---|
| 3,460,055 | 8/1969 | Josenhans et al. | 331/96 |
| 3,516,018 | 6/1970 | Yu et al. | 331/107 G |
| 3,308,352 | 3/1967 | Hutchins et al. | 317/234 |
| 3,328,730 | 6/1967 | Dowdell, Jr. | 333/84 |
| 3,336,535 | 8/1967 | Mosher | 331/107 |
| 3,343,107 | 9/1967 | Golightly | 333/84 |
| 3,346,825 | 10/1967 | Scott et al. | 333/98 |
| 3,465,265 | 9/1969 | Kuru | 317/234 X |
| 3,469,171 | 9/1969 | Toulemonde et al. | 317/234 X |
| 3,487,334 | 12/1969 | Eastman et al. | 317/234 X |

*Primary Examiner*—Roy Lake
*Assistant Examiner*—Siegfried H. Grimm
*Attorneys*—Harold A. Murphy and Edgar O. Rost

ABSTRACT: Semiconductor devices individually as well as in stacked arrays for operation at increased electrical power levels are supported by heat sink structures of a conductive material within a transmission line section to generate oscillations at microwave frequencies. Dissipation of the thermal energy generated, particularly in such devices operated at high power densities and exhibiting negative resistance characteristics in enhanced by the increased radiation surfaces coupled to the semiconductor. The semiconductor devices are electrically insulated DC-wise when mounted within the transmission line which also serves as the circuit for the generation of the AC field.

PATENTED JUL 13 1971 3,593,186

INVENTOR
EDWARD C. DENCH
BY Elgin O. Rost
ATTORNEY

THERMAL DISSIPATION IN SEMICONDUCTOR DEVICE ARRAYS

BACKGROUND OF THE INVENTION

Solid-state devices particularly for generation and amplification of microwave energy have evolved utilizing plural as well as single junction semiconductor materials. Many effects such as avalanche generation and transit time delay are prevalent in semiconductor devices exhibiting negative resistance characteristics. In the avalanche process for example valance electrons in the semiconductor doped regions achieve mobility in the conduction band producing hole-electron pairs. Subsequently the hole-electron pairs collide with surrounding atoms in the process referred to in the art as impact ionization. This process then provides for internal secondary emissions at a PN junction reverse biased into breakdown.

Examples of such avalanche-transit time semiconductor devices include the so-called Read PNIN device having a sharp PN junction avalanche region at one end followed by an intrinsic region and a heavily doped N+ region. The PIN device is another variety and provides for the avalanche ionization produced wholly in the intrinsic region. Another structure in this group includes a PN junction diode. In all the aforesaid examples the junction profile may be provided in the bulk semiconductor material by diffusion or epitaxial grown impurity techniques.

In addition, another class of solid-state devices referred to as Gunn effect devices for generation of microwave energy are energized by high electric biasing fields in semiconductor materials with electric domains traveling within the material. With an AC voltage superimposed on the DC bias a negative resistance over the frequency range arises. In the foregoing bulk effect negative resistance devices the rather high power densities applicable within the semiconductor material which may be in the order of magnitude as high as $10^6$ watts per square centimeter require the efficient dissipation of the thermal energy generated. Higher power levels are being continually required in the art today. Simply increasing the areas, however, without improved thermal dissipation structures will be to no avail. A multiplicity of arrays of the applicable devices mounted within transmission lines must also be considered as far as removal of heat is concerned in order to provide improved microwave solid-state devices.

SUMMARY OF THE INVENTION

In accordance with the teachings of the present invention I provide a plurality of solid-state microwave devices in series electrically in a cascade stacked arrangement. Such devices may illustratively be of the so-called bulk effect configuration exhibiting negative resistance characteristics. A plurality of such devices may be spaced along a transmission line either in cascade arrays or individually with a spacing of one-half a guided wavelength apart to provide an effective oscillator or amplifier circuit. In such an arrangement a high impedance would be positioned approximately one-quarter of a guided wavelength from the nearest array in the manner well known in the art.

To facilitate the high electrical powers envisaged and effectively remove the thermal energy generated conductive members are joined to the semiconductor devices and extend laterally to the adjacent transmission line wall structure. In those embodiments having an integral heat sink arrangement adjacent the semiconductor body the thermal conductive members would be joined immediately adjacent to such heat sinks. The semiconductor arrays will thereby be thermally arranged in parallel with the heat conductive members disposed co-planar. In those embodiments employing rectangular waveguide transmission lines the thermal conductive members would be disposed parallel to the broad waveguide walls or perpendicular to the E-vector of transmitted TEM electromagnetic wave energy.

The mounting of the plurality of semiconductor devices in a transmission line will require the insulation of DC voltages for biasing of the semiconductor devices in the desired potential regions. Electrical insulating materials having a high thermal conductivity are provided adjacent the ends of the conductive members to join these members to the transmission line walls. Preferred materials include beryllia, alumina, as well as boron nitride.

Higher powers for solid-state oscillators and/or amplifiers, particularly of the avalanche-transit time or Gunn effect variety, will be realized through the novel arrangement in transmission lines and effective thermal energy removal afforded by the invention.

BRIEF DESCRIPTION OF THE DRAWINGS

The invention will now be described, reference being directed to the accompanying drawings in which.

DESCRIPTION OF THE PREFERRED EMBODIMENT

Figure 1:
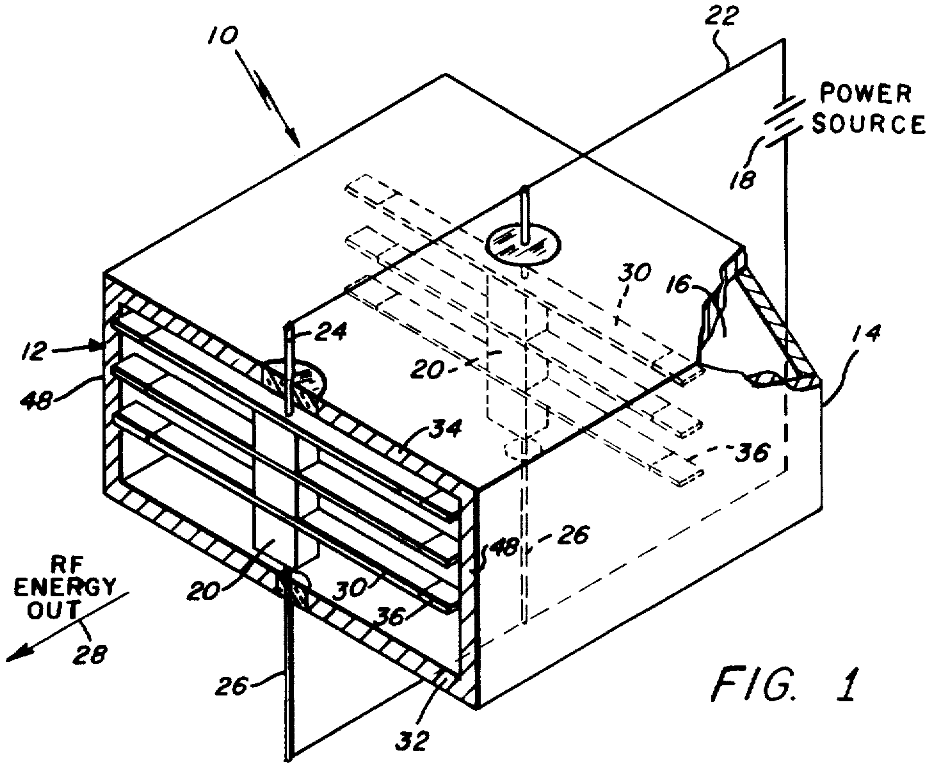
FIG. 1 is a partial isometric view, illustrative of a plurality of semiconductor devices in stacked arrays.

Referring to FIG. 1 of the drawings, an overall illustrative embodiment of the invention is shown and designated by the numeral 10. A section of transmission line 12 for electromagnetic energy desirably closed at one end as at 14 may be dimensioned to define a cavity resonator 16 in the manner well known in the art. While rectangular hollow pipe waveguide has been disclosed in the illustration, the invention in its broadest aspects is equally applicable to other transmission line configurations.

A multiplicity of semiconductor devices 20 are stacked in arrays so as to be serially electrically connected within the transmission line 12. An appropriate DC energy source 18 is connected by appropriate leads 22 to pin terminal connectors 24 and 26 leading to each array of semiconductor devices. Biasing of the devices at the requisite voltage potentials dependent on the type selected together will the transmission line parameters will lead to the generation of AC energy. Suitable means well known in the art will be utilized to couple out the generated energy in the direction indicated by the arrow 28. Such coupling means have not been illustrated for the sake of clarity in the description of the invention. The semiconductor array is also disposed at a distance of one-quarter of a guided wavelength from the closed end wall 14 to thereby provide a high impedance arrangement in the manner also well known in the art.

Each of the semiconductor devices is supported within the resonator structure 16 by means of thermally conductive members 30. Such members are disposed substantially parallel to the broader waveguide walls 32 and 34. In this manner while the semiconductor devices are in series electrically to yield the higher microwave output their cooling will be effected in parallel.

The ends of each conductive member 30 are joined to the transmission structure walls 48 and electrically insulated therefrom to avoid short circuiting of the overall circuit. Preferably, such insulation materials to provide for the support of the thermally conductive members should provide a high thermal conductivity as well as the desired electrical insulation. Insulator members 36 therefore are preferably fabricated from a group of materials including beryllia, alumina and boron nitride.

Figure 2:
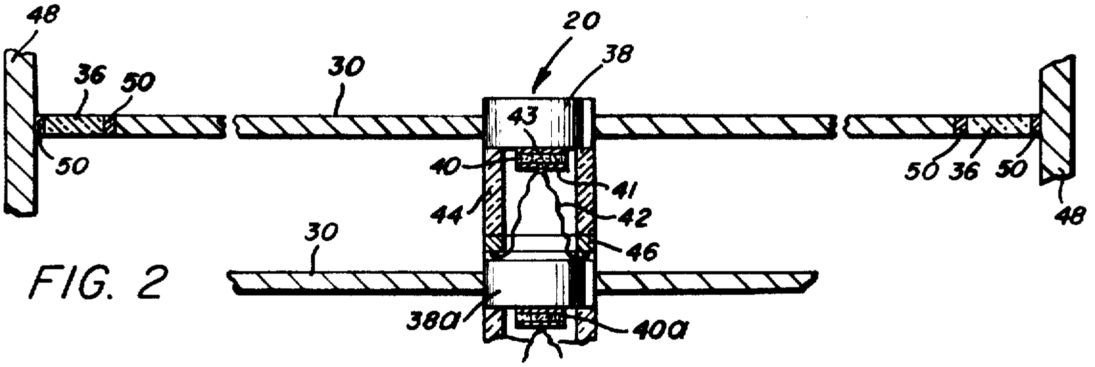
FIG. 2 is a fragmentary cross-sectional view illustrative of the method of joining of the semiconductor devices to the thermal conductive members and support structure.

An illustrative method of attachment of the semiconductor devices as well as a description of an exemplary embodiment will now be described, reference being directed to FIG. 2. In this view a negative resistance device 20 of the avalanche-transit time type having substantially large heat sink block members 38 supports the semiconductor body 40 having electrodes 41 and 43. Desirably blocks 38 may be of a highly conductive metal such as copper.

The connector element 42 of the semiconductor device extends within a substantially hollow cylindrical body member 44 of a ceramic material and is conventionally secured to the electrode 41 of the semiconductor body. The outer end of the cathode element is joined to a conductive ring 46 secured to the body member 44. A flange structure could also be employed for securing the cathode element. In this embodiment a second copper block member 38*a* having a semiconductor body 40*a* is shown as a part of an overall vertical stacked array of a plurality of semiconductor devices.

Coplanar thermal conductive members 30 of a highly conductive metal such as copper will be united with the heat sink block members 38 and 38*a* by conventional bonding techniques. The parallel disposition of the thermal conductive members perpendicular to the E-field vector of microwave energy as well as the desired support will have a bearing on the thickness of these members 30. A material having a thickness of 10 to 20 thousandths of an inch will suffice in most embodiments.

The insulator members 36 are appended to the ends of the thermal conductive members 30 and the narrow waveguide walls 48 by conventional metallurgical techniques. One such method provides for the disposition of a lamination member 50 of molybdenum between the copper thermal member 30 and insulator body members 36 which may illustratively be of beryllium oxide. Similarly, a molybdenum laminate member 50 unites the remaining end of members 36 to the walls 48.

The beryllium oxide members are preferably metallized with a molybdenum manganese mixture and subsequently plated with nickel or copper. The molybdenum members are rhodium plated on both sides with a very thin flash layer. A eutectic solder of an alloy of copper and silver or any other suitable brazing material is utilized to unite the molybdenum, copper and beryllium components in a high temperature brazing oven. The semiconductor devices are then joined to the copper conductive members to provide the rigid support and thermal conductivity.

Figure 3:
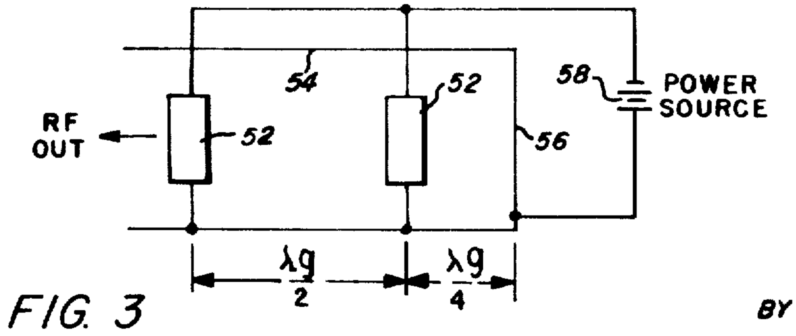
FIG. 3 is a schematic view illustrative of an arrangement for increased microwave power output.

FIG. 3 illustrates a unique method of generating high power microwave energy with either individual or stacked arrays of semiconductor devices generally referred to by numeral 52. A transmission line 54 is short circuited at one end by wall means 56. DC biasing is provided by power source 58 connected to end wall means 56 and devices 52. The disposition of the semiconductor devices at one-half guided wavelength intervals results in the devices becoming effectively in parallel electrically to yield higher outputs of RF energy. The semiconductor devices also need not be disposed in the center of the wave transmission line and can be provided collectively along one wall of the waveguide in the manner well known in the art. With a plurality of negative resistance devices arranged within a transmission line a growing energy wave will result.

Many modifications and variations will be readily apparent to those skilled in the art. It is intended therefore that the invention be limited only as to the breadth and scope as defined in the appended claims.

What I claim is:

1. Microwave energy transmission apparatus comprising:
a section of transmission line for propagating electromagnetic energy;
and semiconductor means disposed along said propagation path by support means joined to the walls of said transmission line section and extending in a direction perpendicular to the electric field of said energy;
said support means including thermally conductive members with electrical insulating members appended to the ends thereof.

2. Microwave energy transmission apparatus comprising:
a section of transmission line defining a propagation path for electromagnetic energy;
plural semiconductor means in stacked arrays disposed along said propagation path by support means joined to the walls of said transmission line section and extending in a direction perpendicular to the electric field of said energy;
said semiconductor means being electrically connected in series;
said support means including parallel disposed thermally conductive members for dissipation of heat generated by said semiconductor means;
and members of an insulating material having a high thermal conductivity appended to the ends of said thermally conductive members adjacent to the point of joining to said transmission line section.

3. Microwave energy transmission apparatus comprising broad and narrow wall structure defining a transmission line providing a propagation path for electromagnetic energy;
plural semiconductor means disposed along said propagation path;
and thermal dissipation means connected to each semiconductor means;
said dissipation means including a thermally conductive member of a metallic material with members of an electrical insulating material appended to the ends;
all of said thermal dissipation means providing for the removal of heat substantially in parallel to the broad walls with the insulating members joined to the narrow transmission line walls.

4. Microwave energy transmission apparatus comprising:
a section of transmission line having broad and narrow walls defining a propagation path for electromagnetic energy;
plural stacked arrays of semiconductor means each arranged in series electrically disposed along said propagation path;
said semiconductor means each having a body of a conductive heat sink material supporting the semiconductor material;
thermal dissipation means connected to said heat sink bodies and said transmission line in a direction substantially parallel to said broad walls;
said dissipation means including thermally conductive members with members of an electrical insulating material appended to the ends thereof;
and means for electrically biasing said semiconductor means at a predetermined voltage potential in a direction substantially parallel to the electric field of said energy.

5. Microwave energy transmission apparatus comprising:
a section of transmission line defining a propagation path for electromagnetic energy;
and plural semiconductor means of the negative resistance type disposed at intervals of one-half a guided wavelength by support means extending substantially perpendicular to the electric field of said energy and joined to the walls of said transmission line section;
said support members including metallic members with electrical insulating members appended to the ends thereof.

6. A method of cooling semiconductor devices disposed within a transmission line section having a broad and narrow dimension comprising the steps of:
supporting all of said devices by thermally conductive support members arranged in a direction substantially parallel to the broad dimension of said transmission line;
and joining the ends of said thermally conductive members with an electrically insulating material to the narrow dimension members of said transmission line section.